(12) United States Patent
Wang et al.

(10) Patent No.: US 11,179,668 B2
(45) Date of Patent: Nov. 23, 2021

(54) METHODS FOR EXTRACTING AND RECYCLING HYDROGEN FROM MOCVD PROCESS EXHAUST GAS BY FTRPSA

(71) Applicant: Zhejiang Tiancaiyunji Technology Co., Ltd., Jiaxing (CN)

(72) Inventors: Lanhai Wang, Jiaxing (CN); Yaling Zhong, Jiaxing (CN); Yun Chen, Jiaxing (CN); Jincai Tang, Jiaxing (CN); Yueming Cai, Jiaxing (CN); Yuming Zhong, Jiaxing (CN)

(73) Assignee: Zhejiang Tiancaiyunji Technology Co., Ltd., Jiaxing (CN)

( * ) Notice: Subject to any disclaimer, the term of this patent is extended or adjusted under 35 U.S.C. 154(b) by 251 days.

(21) Appl. No.: 16/423,167

(22) Filed: May 28, 2019

(65) Prior Publication Data

US 2019/0366259 A1    Dec. 5, 2019

(30) Foreign Application Priority Data

May 29, 2018    (CN) .......................... 201810526174.X

(51) Int. Cl.
| | |
|---|---|
| *B01D 53/047* | (2006.01) |
| *C01B 3/52* | (2006.01) |
| *B01D 51/10* | (2006.01) |
| *B01D 53/14* | (2006.01) |
| *B01D 53/04* | (2006.01) |
| *B01D 53/26* | (2006.01) |
| *B01D 53/58* | (2006.01) |
| *B01D 53/78* | (2006.01) |
| *B01D 53/86* | (2006.01) |
| *B01D 53/22* | (2006.01) |
| *C23C 16/44* | (2006.01) |

(52) U.S. Cl.
CPC .......... *B01D 53/047* (2013.01); *B01D 51/10* (2013.01); *B01D 53/0462* (2013.01); *B01D 53/145* (2013.01); *B01D 53/1406* (2013.01); *B01D 53/1493* (2013.01); *B01D 53/229* (2013.01); *B01D 53/261* (2013.01); *B01D 53/58* (2013.01); *B01D 53/78* (2013.01); *B01D 53/8671* (2013.01); *C01B 3/52* (2013.01); *B01D 2252/103* (2013.01); *B01D 2253/102* (2013.01); *B01D 2253/104* (2013.01); *B01D 2253/106* (2013.01); *B01D 2253/108* (2013.01); *B01D 2253/1122* (2013.01); *B01D 2256/16* (2013.01); *B01D 2257/104* (2013.01); *B01D 2257/108* (2013.01); *B01D 2257/406* (2013.01); *B01D 2257/80* (2013.01); *B01D 2259/40039* (2013.01); *B01D 2259/40052* (2013.01); *C01B 2203/042* (2013.01); *C01B 2203/0435* (2013.01); *C23C 16/4412* (2013.01)

(58) Field of Classification Search
CPC .. C01B 3/00; C01B 3/50; C01B 3/506; C01B 3/508; C01B 3/56; C01B 3/58; C01B 3/02; B01D 53/0462; B01D 53/047; B01D 53/0476; B01D 53/46; B01D 53/75; B01D 2221/14; B01D 2257/00; B01D 2258/0216
See application file for complete search history.

(56) References Cited

U.S. PATENT DOCUMENTS

| | | | | |
|---|---|---|---|---|
| 7,670,408 | B2 * | 3/2010 | Ota ........................ | C01B 32/306 95/96 |
| 7,824,472 | B2 * | 11/2010 | Urakami .............. | C01B 23/0063 95/96 |
| 2006/0099123 | A1 * | 5/2006 | Seeley ................ | B01D 53/8634 423/237 |
| 2012/0272827 | A1 * | 11/2012 | Kamei .................. | B01D 53/047 96/144 |
| 2018/0318750 | A1 * | 11/2018 | Zhong ....................... | C01B 3/56 |
| 2019/0275460 | A1 * | 9/2019 | Zhong ................... | H01L 33/005 |
| 2019/0366260 | A1 * | 12/2019 | Wang ................... | B01D 53/002 |

FOREIGN PATENT DOCUMENTS

| | | | | |
|---|---|---|---|---|
| EP | 1 246 694 A4 * | 7/2003 | ............. | B01D 53/04 |
| EP | 2 061 578 A1 * | 5/2009 | ......... | C23C 16/4412 |
| WO | WO 2008 032 108 A1 * | 3/2008 | ......... | C23C 16/4412 |

* cited by examiner

*Primary Examiner* — Timothy C Vanoy
(74) *Attorney, Agent, or Firm* — Minder Law Group; Willy H. Wong

(57) ABSTRACT

The present invention discloses methods for extracting and recycling hydrogen in an MOCVD process by FTrPSA. Through pretreatment, fine deamination, PSA hydrogen extraction, deep dehydration and hydrogen purification procedures, ammonia-containing waste hydrogen from an MOCVD process is purified to meet the electronic-level hydrogen (the purity is greater than or equal to 99.99999% v/v) standard required by the MOCVD process, to implement resource reuse of exhaust gases, where the hydrogen yield is greater than or equal to 75-86%. The present invention solves the technical problem that atmospheric-pressure or low-pressure waste hydrogen from MOCVD processes cannot be returned to the MOCVD processes for use after being recycled, and fills the gap in green and circular economy development of the LED industry.

16 Claims, 2 Drawing Sheets

METHODS FOR EXTRACTING AND RECYCLING HYDROGEN FROM MOCVD PROCESS EXHAUST GAS BY FTRPSA

CROSS REFERENCE OF RELATED APPLICATION

This application claims priority under 35 U.S.C. 119 to China Patent Application No. 201810526174.X, filed May 29, 2018.

BACKGROUND OF THE PRESENT INVENTION

Field of Invention

The present invention relates to the field of electronic environmental protection for preparing process Hydrogen (H2) and recycling H2 from an exhaust gas in a semiconductor LED (Light Emitting Diode) manufacturing process, and in particular, to methods for extracting and recycling hydrogen from a MOCVD (Metal-Organic Chemical Vapor Deposition) process exhaust gas by FTrPSA (Full Temperature Range-Pressure Swing Adsorption).

Description of Related Arts

AN MOCVD process (equipment), as a modern method and means for conducting research and production of compound semiconductor materials, in particular as a method and equipment for industrial production of novel light emitting materials-LEDs, is irreplaceable by other semiconductor material growing methods and equipment due to its high quality, high stability, high repeatability, and large-scale property, and becomes a main method and means for producing photoelectric device materials and microwave device materials in today's world. In addition to the LEDs, lasers, detectors, efficient solar cells, photoelectric cathodes and the like may also be involved, so that the MOCVD process (equipment) is an indispensable method and equipment in the photo-electronic industry. For example, blue and violet LEDs which are widely applied in the market are all produced by using gallium nitride (GaN) based materials. In an MOCVD epitaxy process, a high-purity Metal Oxide (MO) is used as an MO source, for example, trimethyl gallium (TMGa), carried by electronic-level carrier hydrogen (H2, having a purity of 99.99999% (7N) or more) and nitrogen (N2, having a purity of 99.99999% (7N) or more), and enters an MOCVD reaction kettle together with an electronic-level ammonia gas (NH3), and over a sapphire (Al2O3) substrate heated to an appropriate temperature, the gas-state metal oxide TMGa is controlled to be delivered to the surface of the sapphire substrate for growing a semiconductor thin-film epitaxial material GaN having specific components, a specific thickness, and specific electrical and optical parameters. In order to ensure complete reaction in an MOCVD reaction chamber, H2, N2, and NH3 are all provided in an excessive amount, so that an MOCVD gas having a large amount of H2, N2, and NH3 is generated. A typical LED GaN MOCVD epitaxial tail gas consists of: N2: 60% (v/v, the same below); H2: 25%; NH3: 14%; and the balance of metal ions, particles, methane (CH4), oxygen (O2), and oxides such as carbon monoxide (CO), carbon dioxide (CO2), and water (H2O), with the total amount being less than 1%.

Because an MOCVD process tail gas in LED preparation contains impurities such as highly corrosive NH3, flammable and explosive H2, metal ions, arsine (AsH3), and oxides, it is quite difficult to purify and recycle H2 and return same to the LED manufacturing process. At present, most LED chip or wafer manufacturers remove or convert corrosive NH3 into ammonia water or other ammonia compound liquids in various ways such as washing, catalytic conversion, adsorption, and rectification. The tail gas subjected to deamination has low H2 concentration and contains a large amount of N2 and a small amount of NH3, recycling H2 becomes uneconomical, even if recycling is performed, the recycled H2 does not meet the requirements of electronic-level hydrogen (7N or higher or SEMI-C) and is returned to the MOCVD process as lots of other trace impurities are introduced into the tail gas in MOCVD. The manufacturers or wafer fab. use generally catalytic fuel or acid-base washing to remove harmful and toxic impurities and then use a hydrogen emission system or directly exhaust the tail gas, resulting in great waste of H2 resources.

At present, there are several main methods for recycling H2 from hydrogen-containing exhaust gas at home and abroad, for example, the main methods for extracting, purifying and recycling H2 include Pressure Swing Adsorption (PSA), Temperature Swing Adsorption (TSA), hydrogen permeable membrane separation, low temperature fractionation, and low temperature distillation, a cryogenic method, and the like. Because the composition of the MOCVD process exhaust gas is relatively special, the recycled H2 needs to be returned to the MOCVD process for reused, the electronic waste hydrogen (EH2) and waste ammonia recycling and reusing technology encounters the following difficulties:

first: at present, there is no relevant technology for purifying and recycling H2 from ammonia-containing MOCVD process waste hydrogen and returning same to the process for reused;

second, the H2 content in the exhaust gas is low and less than 30-40%, which is not suitable for the optimal treatment range of traditional PSA or TSA method (greater than 50-60%), and thus the economic benefits are poor, and no electronic-level hydrogen (PH2) products can be obtained;

third, the exhaust gas has a low pressure, and needs to be pressurized to a higher pressure, then the hydrogen permeable membrane separation can be used; however, since the exhaust gas contains a high concentration of corrosive NH3, and NH3 has a great influence on the service life and flow rate of the hydrogen permeable membrane, NH3 must be removed first, and the deamination depth shall be at least less than 10-100 ppm;

fourth, for the purification and recycling of the ammonia-containing MOCVD waste hydrogen, the method of recycling NH3 directly by washing, sulfuric acid absorption and the like is relatively mature, and the energy consumption is relatively large; however, due to the limitation of absorption equilibrium, deep removal cannot be achieved, which directly affects the efficiency of hydrogen purification by adsorption; how to reduce the energy consumption in the traditional ammonia removal process and achieve deep deamination is a major technical challenge for the purification, recycling, and reuse of waste hydrogen;

fifth, for the MOCVD waste hydrogen system, in addition to ammonia, there is a large amount of inert gas N2, and the relative separation coefficient of H2-N2 is very small; with traditional PSA or TSA, it is difficult to achieve higher recycling rate or higher recovery (higher than or equal to 75%) of ultra-high purity hydrogen (99.999-99.9995%), and in addition, the waste hydrogen system may contain trace impurities such as methane, CO and O2 which are almost close to the separation coefficient of H2-N2, and therefore, the system for separating and purifying H2 is very complicated; and sixth, the greatest difficulty in purifying and recycling H2 from the ammonia-containing MOCVD process exhaust gas and returning same to the process is that the H2 purification, recycling, and reusing process is subject to not only different original front-end pretreatment processes of the MOCVD tail gas, but also different fixed rear-end purification processes. Therefore, the requirements on the H2 purification, recycling and reusing process for the tail gas between the front-end pretreatment and the rear-end purification are more demanding.

SUMMARY OF THE PRESENT INVENTION

The present invention provides a method for extracting and recycling hydrogen from MOCVD processes tail gas by FTrPSA, that is a method based on PSA and capable of being coupled with various separation techniques. On the basis of differences in adsorption separation coefficients and physicochemical properties of different material components under different pressures and temperatures, by using an easy-to-match and easy-to-balance cyclic operation of adsorption and desorption in medium, shallow, and low temperature PSA processes, the required effective component (H2 (having a purity of greater than or equal to 99.9995%)) is separated and purified, and on the basis of physicochemical characteristics, relative separation coefficients, corresponding separation and purification methods, and corresponding operating conditions (temperature and pressure) of multiple components (mainly H2, NH3, N2, methane (CH4), carbon monoxide (CO), carbon dioxide (CO2), oxygen (O2), water (H2O), silane (SiH4), and the like) in the electronic-level waste gas generated in an LED-MOCVD process, different conventional physical adsorptions and absorptions as well as chemical adsorptions and absorptions are coupled to implement hydrogen extraction and recycling from the MOCVD process exhaust gas by FTrPSA. For this purpose, the present invention adopts the following technical solution to extract and recycle H2 from a tail gas:

a method for extracting and recycling hydrogen from an MOCVD process exhaust gas by full temperature range-pressure swing adsorption, including the following steps:

(1) a feed gas, i.e., an exhaust gas in a manufacturing process of a LED based on gallium nitride (GaN) epitaxial wafer growth which is prepared by MOCVD at atmospheric pressure or low pressure, the feed gas mainly consisting of nitrogen (N2), hydrogen (H2), and ammonia, as well as a small quantity of metal ions, particles, arsine, methane (CH4), water (H2O), carbon monoxide (CO), carbon dioxide (CO2), and oxygen (O2), and other impurity components, the pressure being atmospheric pressure or low pressure, and the temperature being 20-120° C.;

(2) pretreatment: introducing, by a blower, the feed gas into a pretreatment unit consisting of a feed gas buffer tank, a dust remover, a particle removing filter, an oil mist removing trap, a cooler, an ammonia absorption tower, an ammonia water storage tank, and a cold heat exchanger; under operating conditions of atmospheric pressure or the pressure less than 0.3 MPa and the temperature of 20-120° C., treating the feed gas flowing from the buffer tank to remove dust, particles, oil mist, other water-soluble impurity components, and most of the ammonia in sequence; and proceeding to the next procedure, i.e., a fine deamination procedure, under conditions of the pressure of 0.2-0.3 MPa and the temperature of 20-120° C.;

(3) fine deamination: compressing the feed gas from the pretreatment procedure to 1.0-4.0 MPa, proceeding to a fine deamination procedure consisting of a bath tower and a temperature swing adsorption tower, forming an intermediate gas including low-boiling mixed components after further removing ammonia and other water-soluble or highly-polar trace impurities through washing and temperature swing adsorption, and proceeding to the next procedure, i.e., a de-oxygenation procedure, under conditions of the pressure of 1.0-4.0 MPa and the temperature of 20-120° C.; throughout regenerating on the temperature swing adsorption tower with regenerating a part of a desorbed gas from a subsequent procedure, deep dehydration, as a regeneration carrier gas, and is mixed with the feed gas from the pretreatment procedure; an effective component, hydrogen, contained in the regeneration tail gas is further recycled in the fine deamination procedure;

(4) de-oxygenation: introducing the intermediate gas including low-boiling mixed components from the fine deamination procedure into a deaerator loaded with a catalyst including metal active components, for deep de-oxygenation under conditions of the pressure of 1.0-4.0 MPa and the temperature of 20-120° C., and then proceeding to the next procedure, i.e., a PSA hydrogen extraction procedure;

(5) PSA hydrogen extraction: introducing the deoxygenated intermediate gas including low-boiling mixed components into a multi-tower PSA hydrogen purification procedure consisting of four towers or more, where the operating pressure of adsorption towers is 1.0-4.0 MPa, the operating temperature is 20-120° C., at least one adsorption tower is in an adsorption step, and the remaining adsorption towers are in a desorption and regeneration step, the formed non-adsorbed phase gas is ultra-high purity hydrogen, and the purity thereof is greater than or equal to 99.999-99.9999% (v/v); and proceeding to the next procedure, i.e., a deep dehydration procedure, where an adsorbent in the PSA hydrogen extraction procedure is one or a combination of activated aluminum oxide, silica gel, activated carbon, molecular sieve, and special molecular sieve for de-nitrification; during desorption, a slow pressure equalization approach is used at most three times for pressure equalization, and a flushing or flushing plus vacuum pumping is used, a part of a desorbed gas formed is directly discharged and conforms to the national atmospheric emission standards, and the other part is regenerated as the regeneration carrier gas deeply dehydrated in the subsequent procedure;

(6) deep dehydration: introducing the ultra-high purity hydrogen from the PSA hydrogen extraction procedure into a drying tower, which is used for deep dehydration and consists of two or three temperature swing adsorption towers, for further deep dehydration under conditions of the pressure of 1.0-4.0 MPa and the temperature of 20-120° C., where if there are two towers, one is an adsorption tower and the other one is a regeneration tower; if there are three towers, one is an adsorption tower, one is a regeneration tower, and the last one is a standby or regeneration tower; maintaining continuous discharge of the ultra-high purity hydrogen, and proceeding to the next procedure, i.e., a hydrogen purification procedure, where during regeneration, a part of the ultra-high purity hydrogen from the PSA hydrogen extraction procedure is used as the regeneration carrier gas, and the regeneration tail gas formed after the regeneration is used as the regeneration carrier gas in the temperature swing adsorption step of the fine deamination procedure; and (7) hydrogen purification: making the ultra-high purity hydrogen from the PSA hydrogen extraction procedure pass through an intermediate product storage tank or directly undergo heat exchange, depressurizing the hydrogen directly or by a pressure reducing valve at the temperature of 50-500° C. to the pressure required for hydrogen used in an LED-MOCVD process; proceeding to the hydrogen purification procedure in which coupling is implemented by a metal getter, or a palladium membrane, or a palladium membrane-metal getter, for performing purification under conditions where the operating temperature is 50-500° C. and the operating pressure is from atmospheric pressure to the pressure required for hydrogen used in the MOCVD process, and removing the trace impurities to obtain a final electronic-level hydrogen product, the purity of which meets the electronic-level hydrogen product standards specified by the state or the Semiconductor Equipment and Materials International (SEMI), i.e., the hydrogen purity is greater than or equal to 7-8N level; after cooling by depressurizing, or feeding into the electronic-level hydrogen product tank for storage, or passing through the hydrogen product buffer tank, directly returning to a section of the MOCVD process that requires hydrogen, where the operating temperature of the hydrogen purification procedure is determined by the used the metal getter or palladium membrane, the metal getter or palladium membrane has a service life of at least greater than two years and thus does not need to be regenerated, and therefore, the yield of the obtained electronic-level hydrogen product is greater than 75-86%.

Furthermore, the method for extracting and recycling hydrogen from an MOCVD process exhaust gas by full temperature range-pressure swing adsorption is characterized in that: the feed gas includes an exhaust gas or a tail gas containing main components such as hydrogen, nitrogen and ammonia, and other impurity components generated in the remaining semiconductor manufacturing processes.

Furthermore, the method for extracting and recycling hydrogen from an MOCVD process exhaust gas by full temperature range-pressure swing adsorption is characterized in that: for the ammonia absorption tower in the pretreatment, water is used as a solvent, one-stage, or two-stage, or three-stage stepwise absorption, or water absorption is predominant and coupled with chemical absorption to form ammonia water, or ammonium sulfate, or other ammonia compound liquids, which are fed into ammonia water, or ammonium sulfate, or other ammonia compound liquid storage tanks, and the ammonia content in the pretreated feed gas is ensured to not exceed 1-2% (v/v).

Furthermore, the method for extracting and recycling hydrogen from an MOCVD process exhaust gas by full temperature range-pressure swing adsorption is characterized in that: in the fine deamination, first, the absorption liquid formed by the water washing tower can be used as the solvent for a pretreatment water absorption tower for use in recycling; secondly, the adsorbent loaded in the temperature swing adsorption tower is one or a combination of aluminum oxide, activated carbon, activated carbon loaded with active components, molecular sieves, and molecular sieves loaded with active components.

Furthermore, the method for extracting and recycling hydrogen from an MOCVD process exhaust gas by full temperature range-pressure swing adsorption is characterized in that: for the washing in the fine deamination, the feed gas treated in the pretreatment process, in which the contents of ammonia and water-soluble impurity components are less than 0.1-0.2%, directly enters temperature swing adsorption without washing, where the adsorbent is chemically adsorbed by using activated carbon loaded with active components, aluminum oxide, zeolite molecular sieves, and other combinations, and is not required to be regenerated, or is physically adsorbed and required to be regenerated.

Furthermore, the method for extracting and recycling hydrogen from an MOCVD process exhaust gas by full temperature range-pressure swing adsorption is characterized in that: the PSA hydrogen extraction consists of two stages of PSA systems, i.e., the intermediate gas including low-boiling mixed components, which is formed by feeding the feed gas from the pretreatment procedure into the fine deamination procedure for treatment after passing through the blower or being pressurized to 0.2-0.6 MPa, enters a first-stage PSA tower from the bottom, and a semi-product gas-rich hydrogen of the low-boiling mixed gas flowing from the top of the first-stage PSA tower, is pressurized to 1.0-4.0 MPa by the compressor, and then enters a second-stage PSA tower; the non-adsorbed phase gas flowing from the top of the second-stage PSA tower is ultra-high purity hydrogen having a purity of 99.999-99.9999% (v/v), and enters the next procedure, i.e., the deep dehydration procedure; the second-stage PSA towers are all filled with one or a combination of activated aluminum oxide, silica gel, activated carbon, molecular sieves, and special molecular sieves for de-nitrification; during desorption, a slow pressure equalization approach is used at most three times for pressure equalization, and a flushing or flushing plus vacuum pumping approach is used, where the desorbed gas flowing from the bottom of the first-stage PSA tower is directly discharged; after passing through the blower or compressor, a part of the desorbed gas flowing from the bottom of the second-stage PSA tower by desorption is used in the first-stage PSA tower for vacuum filling, and the other part is mixed with the intermediate gas including low-boiling mixed components and enters the first-stage PSA to further recovering the effective component, hydrogen; the recovery rate of the hydrogen in this procedure is greater than or equal to 80%, and thus the recovery rate of the hydrogen obtained in the hydrogen purification procedure is greater than or equal to 78-80%.

Furthermore, the method for extracting and recycling hydrogen from an MOCVD process exhaust gas by full temperature range-pressure swing adsorption is characterized in that: in the PSA hydrogen extraction, under an operating condition that the adsorption pressure is greater than or equal to 0.6 MPa, slow and uniform control is carried out on pressure changes in a cyclic operation process of adsorption and desorption by means of a program control valve and a regulating valve on pipelines connected between the adsorption towers, so as to prevent beds of the adsorption towers from being scoured by a strong current caused by an excessive pressure change of the system, and avoid the occurrence of adsorbent pulverization, thereby keeping system operations in this procedure stable and secure.

Furthermore, the method for extracting and recycling hydrogen from an MOCVD process exhaust gas by full temperature range-pressure swing adsorption is characterized in that: between the washing in the pretreatment and fine deamination and logistics in the temperature swing adsorption, de-oxygenation, PSA hydrogen extraction, deep dehydration procedures, a temperature swing adsorption regeneration carrier gas and a regeneration tail gas in the fine deamination procedure as well as the feed gas before and after the pretreatment process, or a temperature swing adsorption regeneration carrier gas and a regeneration tail gas in the fine deamination procedure as well as a regeneration tail gas from the deep dehydration, or a temperature swing adsorption effluent gas and a compressor end or multi-stage compression outlet gas in the fine deamination procedure, or an intermediate gas subjected to the de-oxygenation procedure and a regeneration carrier gas subjected to deep dehydration are involved, cold and heat exchange are performed to achieve energy balance of a full temperature range-pressure swing adsorption based hydrogen extraction and reusing system, and the energy of each procedure is also reused.

The present invention has the following beneficial effects:

(1) through the present invention, H2 can be purified and recycled from the ammonia-containing MOCVD process waste hydrogen to produce electronic grade PH2, and returned to the MOCVD process for use, thereby not only implementing the recovery and recycling of hydrogen from the exhaust gas, but also reducing exhaust gas emissions and making up for the blank of LED process exhaust gas treatment technology;

(2) according to the characteristics of physicochemical and relative separation coefficients of tail gas components in the range of medium-shallow temperature (20-120° C.) and medium-low pressure (0.2-4.0 MPa), through the coupling of separation techniques such as physical adsorption and absorption as well as chemical adsorption and absorption, etc., the present invention solves the problem that since the H2 content in the exhaust gas is low and not suitable for the optimal treatment range (greater than 50-60%) of the traditional PSA or TSA method, the economic benefits are poor, and no electronic-level hydrogen (PH2) products cannot be obtained;

(3) in the process of implementing recycling and reusing of H2, the present invention does not bring the MOCVD process and sensitive oxygen-containing compounds thereof, especially O2, H2O, CO, and the like, to the system, so that the entire recycling and reusing process is stable and the impact on the quality of LED chips is reduced to zero;

(4) according to the present invention, in the process of purifying, recycling, and reusing the exhaust gas at atmospheric pressure or low pressure, pressurized treatment or non-pressurized treatment may be used according to use conditions of the process (electronic-level) hydrogen and ammonia gases to obtain an electronic-level hydrogen product;

(5) according to the present invention, on the basis of differences in operating temperatures of different procedures, by arranging a reasonable heat exchange system, the heat of the entire operating system is fully utilized;

(6) according to the present invention, in the PSA hydrogen extraction procedure, a pressure swing approach is fully utilized, and the hydrogen-containing feed gas is deeply purified to remove various micro or even trace impurity components, thereby avoiding the inability to deeply remove the impurity components due to excessively low partial pressure, and also avoiding the problem of introducing a new impurity component formed by hot nitrogen regeneration or heat carrier in the hydrogen purification procedure due to the removal of micro or trace impurity components by conventional TSA, and the problem of cyclic operation due to the difficulty in matching between adsorption and regeneration; not only feeding requirements of the feed gas in the hydrogen purification procedure are ensured, but also the service life of the adsorbent in the PSA hydrogen purification procedure is prolonged; and (7) the present invention solves the greatest difficulty in purifying and recycling H2 for reuse from the ammonia-containing MOCVD process exhaust hydrogen: the process is subject to not only different original front-end pretreatment processes of the MOCVD tail gas, but also different fixed rear-end purification processes. Therefore, the requirements on the H2 purification, recycling and reusing process for the tail gas between the front-end pretreatment and the rear-end purification are more demanding.

DETAILED DESCRIPTION OF THE PREFERRED EMBODIMENT

In order to make a person skilled in the art better understand the present invention, the technical solutions in the embodiments of the present invention are clearly and fully described below with reference to the accompanying drawings in the embodiments of the present invention.

Embodiment 1

Figure 1:
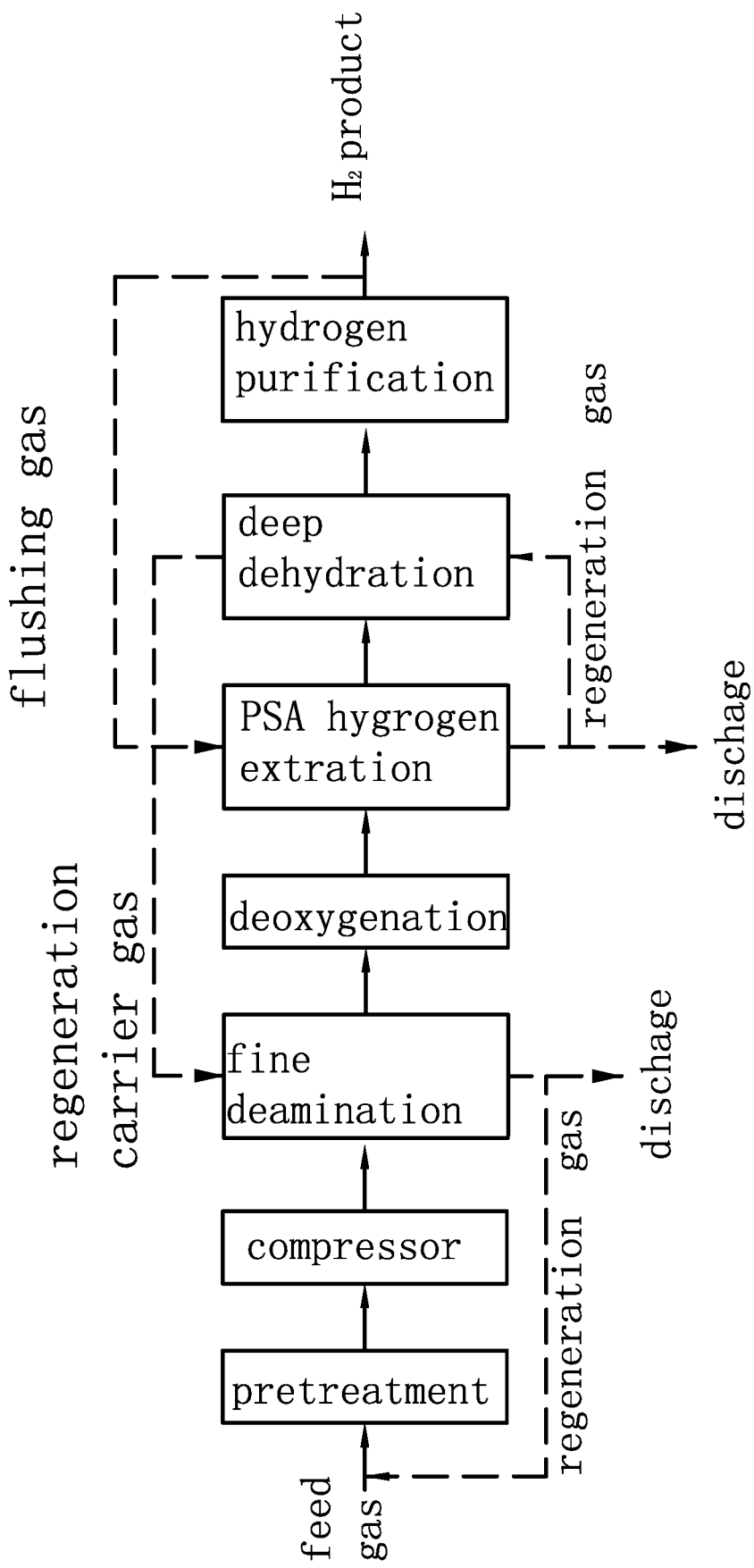
FIG. 1 is a schematic flowchart of embodiment 1 of the present invention.

As shown in FIG. 1, a method for extracting and recycling hydrogen from an MOCVD process exhaust gas by full temperature range-pressure swing adsorption includes the following specific implementation steps:

(1) a feed gas, i.e., an exhaust gas in a manufacturing process for an LED based on gallium nitride epitaxial wafer growth which is prepared by MOCVD at atmospheric pressure or low pressure, the feed gas mainly consisting of 46% (v/v, the same below) of nitrogen (N2), 34% of hydrogen (H2), and 19% of ammonia (NH3), and the remaining 1% being a small quantity of metal ions, particles, arsine, methane (CH4), water (H2O), carbon monoxide (CO), carbon dioxide (CO2), and oxygen (O2), and other impurity components, where the pressure is atmospheric pressure or low pressure, and the temperature is 30-50° C.;

(2) pretreatment: introducing, by a blower, the feed gas into a pretreatment unit consisting of a feed gas buffer tank, a dust remover, a particle removing filter, an oil mist removing trap, a cooler, an ammonia absorption tower, an ammonia water storage tank, and a cold heat exchanger; under operating conditions of the pressure of 0.2-0.3 MPa and the temperature of 30-50° C., treating the feed gas flowing from the buffer tank to remove dust, particles, oil mist, other water-soluble impurity components, and most of the ammonia in sequence; and proceeding to the next procedure, i.e., a fine deamination procedure, under conditions of the pressure of 0.2-0.3 MPa and the temperature of 30-50° C.;

(3) fine deamination: compressing the feed gas from the pretreatment procedure to 2.0-3.0 MPa, proceeding to a fine deamination procedure consisting of a bath tower and a temperature swing adsorption tower, forming an intermediate gas including low-boiling mixed components after further removing ammonia and other water-soluble or highly-polar trace impurities through washing and temperature swing adsorption, and proceeding to the next procedure, i.e., a de-oxygenation procedure, under conditions of the pressure of 2.0-3.0 MPa and the temperature of 30-50° C.; where a regeneration tail gas is formed throughout regenerating on the temperature swing adsorption tower with regenerating a part of a desorbed gas from a subsequent procedure, deep dehydration, as a regeneration carrier gas, and is mixed with the feed gas from the pretreatment procedure; an effective component, hydrogen, contained in the regeneration carrier gas is further recovered in the fine deamination procedure;

(4) de-oxygenation: introducing the intermediate gas including low-boiling mixed components from the fine deamination procedure, after exchanging heat with a fluid at an outlet in the tail end of a compressor, into a deaerator loaded with a catalyst including metal active components, for deep de-oxygenation under conditions of the pressure of 2.0-3.0 MPa and the temperature of 70-90° C., and then proceeding to the next procedure, i.e., a PSA hydrogen extraction procedure;

(5) PSA hydrogen extraction: introducing the deoxygenated intermediate gas including low-boiling mixed components into a multi-tower PSA hydrogen purification procedure consisting of six towers, where the operating pressure of adsorption towers is 2.0-3.0 MPa, the operating temperature is 70-90° C., and two adsorption towers are in an adsorption step, and the remaining four adsorption towers are in a desorption and regeneration step involving two equilibrium pressure drops, normal flowing, reverse flowing, flushing, two equilibrium pressure rises, final flushing; the formed non-adsorbed phase gas is ultra-high purity hydrogen, and the purity thereof is greater than or equal to 99.999-99.9999% (v/v); and proceeding to the next procedure, i.e., a deep dehydration procedure, where every two adsorption towers are automatically switched to a desorption step after the adsorption step is completed, and the continuous discharge of ultra-high purity hydrogen is maintained; the adsorbent for the PSA hydrogen extraction procedure uses a composite combination of activated aluminum oxide, silica gel, activated carbon, and special molecular sieves for de-nitrification; during desorption, a slow pressure equalization approach is used at most twice for pressure equalization, and the ultra-high purity hydrogen is used as a flushing gas for flushing, and forms the desorbed gas together with a reversely discharged gas, a part of the desorbed gas is directly discharged and conforms to the national atmospheric emission standards, and the other part is regenerated as the regeneration carrier gas deeply dehydrated in the subsequent procedure;

(6) deep dehydration: introducing the ultra-high purity hydrogen from the PSA hydrogen extraction procedure into a drying tower, which is used for deep dehydration and consists of two temperature swing adsorption towers, for further deep dehydration under conditions of the pressure of 2.0-3.0 MPa and the temperature of 70-90° C., where if there are two towers, one is an adsorption tower and the other one is a regeneration tower; maintaining continuous discharge of the ultra-high purity hydrogen that is deeply dehydrated, and proceeding to the next procedure, i.e., a hydrogen purification procedure, where during regeneration, a part of the desorbed gas from the PSA hydrogen extraction procedure is used as the regeneration carrier gas subjected to heat exchange, and the regeneration tail gas formed after the regeneration is used as the regeneration carrier gas in the temperature swing adsorption step of the fine deamination procedure;

(7) hydrogen purification: making the ultra-high purity hydrogen from the PSA hydrogen extraction procedure first pass through an intermediate product storage tank and then undergo heat exchange, depressurizing the hydrogen by a pressure reducing valve at the temperature of 300-400° C. to the pressure required for hydrogen used in an LED-MOCVD process, which is 1.6 MPa in this embodiment; proceeding to the hydrogen purification procedure in which a metal getter is involved, for performing purification under conditions where the operating temperature is 300-400° C. and the operating pressure is 1.4-1.6 MPa, and removing the trace impurities to obtain a final electronic-level hydrogen product, the purity of which meets the electronic-level hydrogen product standards specified by the state or the SEMI, i.e., the hydrogen purity is greater than or equal to 7-8N level; after heat exchange, directly returning to a section of the MOCVD process that requires hydrogen, where the operating temperature of the hydrogen purification procedure is determined by the used metal getter, the metal getter has a service life of at least greater than two years and thus does not need to be regenerated, and therefore, the yield of the obtained electronic-level hydrogen product is greater than 76-86%.

Embodiment 2

As shown in FIG. 1, on the basis of embodiment 1, the feed gas from the pretreatment procedure is pressurized to 1.4-1.6 MPa, and then enters the fine deamination procedure for fine deamination; the formed intermediate gas exchanges heat with the fluid at the outlet in the tail end of the compressor to reach 70-90° C., and then enters the de-oxygenation procedure for de-oxygenation; the deoxygenated intermediate gas is cooled to 30-50° C. by heat exchange, and enters the PSA hydrogen extraction procedure for hydrogen purification. In the hydrogen purification procedure, there is no need to adjust the pressure by the reducing valve, and the pressure of the entire system is kept at 1.4-1.6 MPa. The system is relatively stable and the yield of the electronic-level hydrogen product is greater than 75-86%.

Embodiment 3

As shown in FIG. 1, on the basis of embodiment 1, when the temperature of the feed gas is 100-120° C., the feed gas is pressurized to 3.5-4.0 MPa and cooled to 70-90° C. after exchanging heat with the ultra-high purity hydrogen, and enters the fine deamination, de-oxygenation, PSA hydrogen extraction, and hydrogen purification procedures, where the deoxygenated intermediate gas directly enters the PSA hydrogen extraction procedure without heat exchange, and the yield of the obtained electronic-level hydrogen product is greater than or equal to 75-86%.

Embodiment 4

As shown in FIG. 1, on the basis of embodiment 1, the metal getter in the hydrogen purification procedure is changed into a palladium membrane (shell-and-tube type); the deeply dehydrated ultra-high purity hydrogen directly enters the hydrogen purification procedure without heat exchange, directly enters the hydrogen purification procedure consisting of palladium membranes at a temperature of 70-90° C., is purified under conditions where the operating temperature is 70-90° C. and the operating pressure is 2.0-3.0 MPa to remove the trace impurities, so as to obtain a final electronic-level hydrogen product, the purity of which meets the electronic-level hydrogen product standards specified by the state or the SEMI, i.e., the hydrogen purity is greater than or equal to 7-8N level; after cooling by depressurizing, or passing through the hydrogen product buffer tank, the hydrogen product is directly returned to a section of the MOCVD process that requires hydrogen, where the operating temperature of the hydrogen purification procedure is determined by the used palladium membrane, the palladium membrane has a service life of at least greater than two years and thus does not need to be regenerated, and therefore, the yield of the obtained electronic-level hydrogen product is greater than 75-86%.

Embodiment 5

As shown in FIG. 1, on the basis of embodiment 1, the user has stored working conditions of a hydrogen purification workshop; the hydrogen purification procedure of this embodiment is cancelled; the deeply dehydrated ultra-high purity hydrogen is first fed into the ultra-high purity hydrogen storage tank, and then is fed into the hydrogen purification workshop through a dispensing or distribution pipeline according to the pressure and flow rate required by the MOCVD process. In this case, the yield of the ultra-high purity hydrogen is greater than or equal to 76-87%.

Embodiment 6

Figure 2:
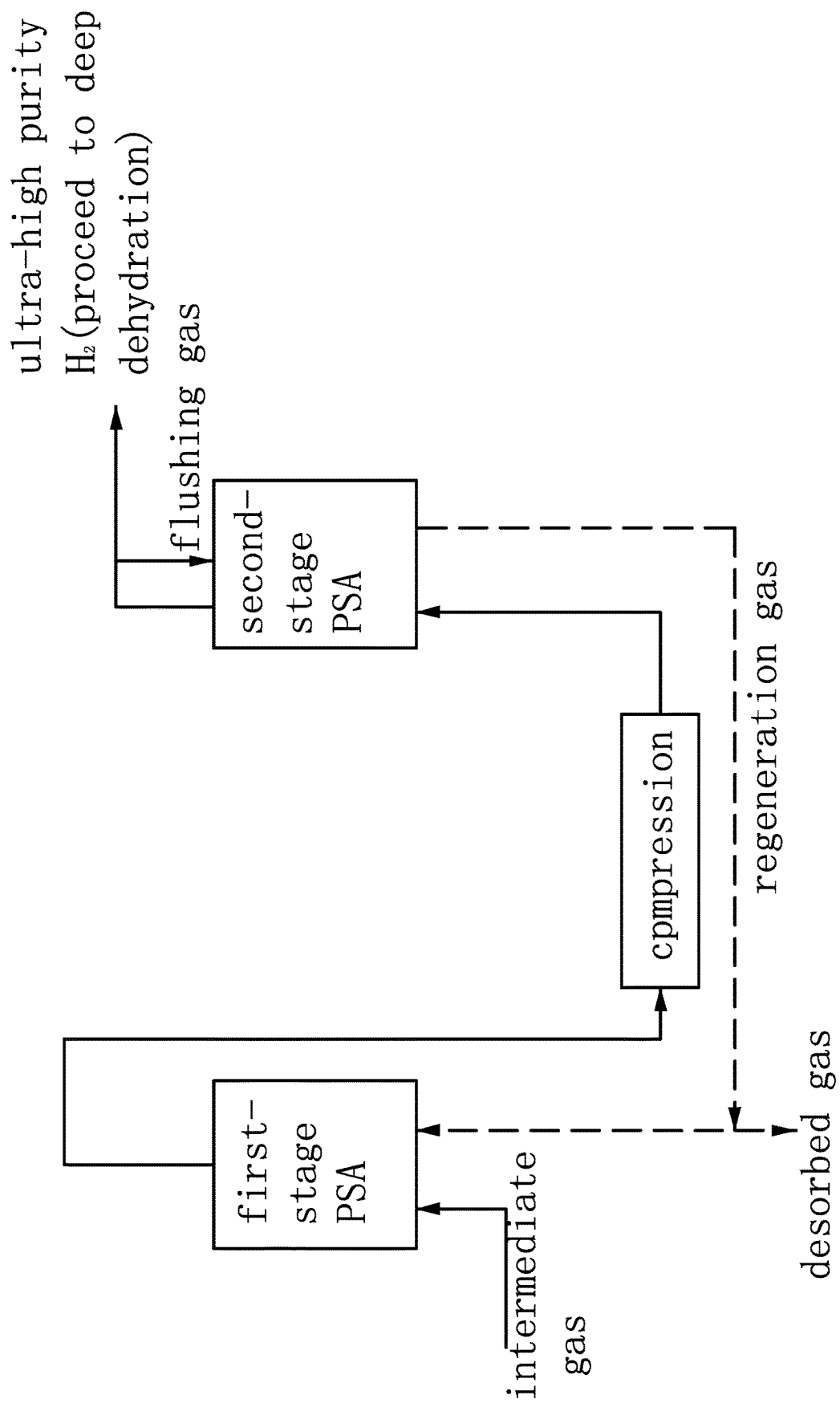
FIG. 2 is a schematic flowchart of embodiment 6 of the present invention.

As shown in FIG. 2, on the basis of embodiment 1, the PSA hydrogen extraction consists of two stages of PSA systems, i.e., the intermediate gas including low-boiling mixed components, which is formed by first pressurizing the pretreated feed gas to 0.6 MPa and then feeding same into the fine deamination procedure for treatment, enters the adsorption tower of a first PSA (first-stage PSA) system consisting of five towers from the bottom, and a semi-product gas-rich hydrogen of the low-boiling mixed gas flowing from the top of the first-stage PSA tower has a hydrogen content up to 65-75% (v/v), is pressurized to 2.0-3.0 MPa by the compressor, and then enters a second PSA (second-stage PSA) system; the non-adsorbed phase gas flowing from the top of the second-stage PSA tower is ultra-high purity hydrogen having a purity of greater than or equal to 99.999-99.9999% (v/v), and enters the next procedure, i.e., the deep dehydration procedure. The two stages of PSA adsorption towers are both filled with a composite combination of activated aluminum oxide, silica gel, activated carbon, and molecular sieves. During desorption, the first-stage PSA relates to performing pressure equalization twice in a slow equalization mode, and a vacuum pumping approach is adopted, where the desorbed gas flowing from the bottom of the first PSA tower is directly discharged; in the second-stage PSA desorption, the ultra-high purity hydrogen is used as a flushing gas for flushing, and forms the desorbed gas together with a reversely discharged gas. A part of the desorbed gas is used in the first-stage PSA tower for vacuum filling, and the other part is mixed with the intermediate gas including low-boiling mixed components and enters the first-stage PSA to further recycle the effective component, hydrogen. The recycling rate of the hydrogen in this procedure is greater than or equal to 79-87%, and thus the yield of the electronic-level hydrogen product obtained in the hydrogen purification procedure is greater than or equal to 78-86%.

Embodiment 7

As shown in FIG. 2, on the basis of embodiments 1 and 6, the five towers of the two-stage PSA system are changed to six towers; the number of pressure equalizations of the two-stage PSA system is changed to 3, a low equalization approach is used, and the yield of the ultra-high purity hydrogen obtained by the PSA hydrogen extraction procedure can be increased to be greater than or equal to 82-87%.

Obviously, the above-mentioned embodiment is only part of the embodiment in the present invention rather than the whole embodiment. Based on the embodiment recorded in the present invention, with respect to all other embodiments obtained by those skilled in the art without paying creative work, or the structural changes made under the inspiration of the present invention, all technical solution that are identical or similar to the present invention fall into the protection scope of the present invention.

What is claimed is:

1. A method for extracting and recycling hydrogen from an MOCVD process exhaust gas by FTrPSA (full temperature range-pressure swing adsorption), comprising following procedures:
　　1) preparing a feed gas, the feed gas being an exhaust gas in a MOCVD manufacturing process of a light emitting diode based on gallium nitride epitaxial wafer growth, the feed gas being at atmospheric pressure, and at a temperature of 20-120° C.;
　　2) executing pretreatment procedure: wherein introducing the feed gas into a pretreatment unit under operating conditions of atmospheric pressure or a pressure less than 0.3 MPa and a temperature of 20-120° C., treating the feed gas flowing to remove dust, particles, oil mist, other water-soluble impurity components, and most ammonia in sequence; and proceeding to next fine deamination procedure under conditions of a pressure of 0.2-0.3 MPa and a temperature of 20-120° C.;
　　3) executing fine deamination procedure: wherein compressing the feed gas from the pretreatment procedure to 1.0-4.0 MPa, proceeding to a fine deamination procedure in fine deamination equipment, forming an intermediate gas after further removing ammonia and other water-soluble or trace impurities through washing and temperature swing adsorption, and proceeding to next de-oxygenation procedure under conditions of the pressure of 1.0-4.0 MPa and the temperature of 20-120° C.;
　　4) executing de-oxygenation procedure: wherein introducing the intermediate gas from the fine deamination procedure into a deaerator loaded with a catalyst comprising metal active components under conditions of a pressure of 1.0-4.0 MPa and a temperature of 20-120° C., and then proceeding to next PSA hydrogen extraction procedure;
　　5) executing PSA hydrogen extraction procedure: wherein introducing a deoxygenated intermediate gas into a multi-tower consisting of adsorption towers, wherein an operating pressure of adsorption towers is 1.0-4.0 MPa, an operating temperature is 20-120° C., at least one adsorption tower is in an adsorption step, and the remaining adsorption towers are in a desorption and regeneration step, a formed non-adsorbed phase gas is ultra-high purity hydrogen with purity of 99.999-99.9995% (v/v) or greater; and proceeding to next deep dehydration procedure;
　　6) executing deep dehydration procedure: wherein introducing the ultra-high purity hydrogen from the PSA hydrogen extraction procedure into a drying tower, under conditions of a pressure of 1.0-4.0 MPa and a temperature of 20-120° C., maintaining continuous discharge of the ultra-high purity hydrogen, and proceeding to next hydrogen purification procedure; and
　　7) executing hydrogen purification procedure: wherein depressurizing the ultra-high purity hydrogen from the pressure swing adsorption hydrogen extraction procedure at a temperature of 50-500° C. to a pressure required for hydrogen used in a LED-MOCVD (Light Emitting Diode Metal-Organic Chemical Vapor Deposition) process; then proceeding to purifying the ultra-high purity hydrogen by a metal getter, or a palladium membrane, or a coupled palladium membrane-metal getter under conditions where an operating temperature is 50-500° C. and an operating pressure is from atmospheric pressure to a pressure required for hydrogen used in the LED-MOCVD process, and removing a trace impurities to obtain a final electronic-level hydrogen product.

2. The method for extracting and recycling hydrogen from an MOCVD process exhaust gas by FTrPSA according to claim 1, wherein the feed gas mainly comprises nitrogen, hydrogen, and ammonia, as well as metal ions, particles, arsine, methane, water, carbon monoxide, carbon dioxide, and oxygen, as well as other impurity components.

3. The method for extracting and recycling hydrogen from an MOCVD process exhaust gas by FTrPSA according to claim 1, wherein the feed gas further comprises an exhaust gas or a tail gas, main components of which are hydrogen, nitrogen and ammonia, and other impurity components generated in the remaining semiconductor manufacturing processes.

4. The method for extracting and recycling hydrogen from an MOCVD process exhaust gas by FTrPSA according to claim 1, wherein the pretreatment unit comprises a feed gas buffer tank, a dust remover, a particle removing filter, an oil mist removing trap, a cooler, an ammonia absorption tower, an ammonia water storage tank, and a cold heat exchanger.

5. The method for extracting and recycling hydrogen from an MOCVD process exhaust gas by FTrPSA according to claim 4, wherein in the ammonia absorption tower in the pretreatment procedure, water is used as a solvent, one-stage, or two-stage, or three-stage stepwise absorption, or water absorption is predominant and coupled with chemical absorption to form ammonia water, or ammonium sulfate, or other ammonia compound liquids, which are fed into ammonia water, or ammonium sulfate, or other ammonia compound liquid storage tanks, and ammonia content in the pretreated feed gas is ensured to not exceed 1-2% (v/v).

6. The method for extracting and recycling hydrogen from an MOCVD process exhaust gas by FTrPSA according to claim 1, wherein the fine deamination equipment comprises a bath tower and a temperature swing adsorption tower, a regeneration tail gas is formed throughout regenerating on the temperature swing adsorption tower with regenerating a part of a desorbed gas from a subsequent procedure, deep dehydration, as a regeneration carrier gas, and is mixed with the feed gas from the pretreatment procedure; an effective component, hydrogen, contained in the regeneration gas is further recycled in the fine deamination procedure.

7. The method for extracting and recycling hydrogen from an MOCVD process exhaust gas by FTrPSA according to claim 6, wherein in the fine deamination procedure, first, absorption liquid formed by a water washing tower capable of being used as solvent for a pretreatment water absorption tower for use in recycling; secondly, an adsorbent loaded in the temperature swing adsorption tower is one or a combination of aluminum oxide, activated carbon, activated carbon loaded with active components, molecular sieves, and molecular sieves loaded with active components.

8. The method for extracting and recycling hydrogen from an MOCVD process exhaust gas by FTrPSA according to claim 1, wherein for the washing in the fine deamination, the feed gas treated in the pretreatment procedure, in which ammonia content and water-soluble impurity components are less than 0.1-0.2%; wherein an adsorbent is chemically adsorbed by using activated carbon loaded with active components, aluminum oxide, zeolite molecular sieves, and other combinations, and is not required to be regenerated, or is physically adsorbed and required to be regenerated.

9. The method for extracting and recycling hydrogen from an MOCVD process exhaust gas by FTrPSA according to claim 1, wherein an adsorbent in the PSA hydrogen extraction procedure is one or a combination of activated aluminum oxide, silica gel, activated carbon, molecular sieve, and molecular sieve for denitrification.

10. The method for extracting and recycling hydrogen from an MOCVD process exhaust gas by FTrPSA according to claim 6, wherein during desorption, a flushing or flushing plus vacuum pumping is used, a part of a desorbed gas formed is directly discharged and conforms to national atmospheric emission standards, and the other part is regenerated as the regeneration carrier gas deeply dehydrated in the subsequent procedure.

11. The method for extracting and recycling hydrogen from an MOCVD process exhaust gas by FTrPSA according to claim 1, wherein the intermediate gas passing through a blower or being pressurized to 0.2-0.6 MPa, enters a first-stage PSA tower from a bottom of the first-stage PSA tower, and a semi-product gas-rich hydrogen flowing from a top of the first-stage PSA tower is pressurized to 1.0-4.0 MPa by a compressor, and then enters a second-stage PSA tower; a non-adsorbed phase gas flowing from a top of the second-stage PSA tower is ultra-high purity hydrogen, and enters next deep dehydration procedure.

12. The method for extracting and recycling hydrogen from an MOCVD process exhaust gas by FTrPSA according to claim 11, wherein the second-stage PSA tower are all filled with one or a combination of activated aluminum oxide, silica gel, activated carbon, molecular sieves, and molecular sieves for denitrification.

13. The method for extracting and recycling hydrogen from an MOCVD process exhaust gas by FTrPSA according to claim 12, wherein during desorption, a flushing or flushing plus vacuum pumping approach is used, wherein the desorbed gas flowing from the bottom of the first-stage PSA tower is directly discharged; after passing through the blower or compressor, a part of the desorbed gas flowing from the bottom of the second-stage PSA tower by desorption fills the first PSA tower for use in vacuum, and the other part is mixed with the intermediate gas and enters the first-stage PSA to further recycle the effective component hydrogen.

14. The method for extracting and recycling hydrogen from an MOCVD process exhaust gas by FTrPSA according to claim 1, wherein the dry tower comprises two or three temperature swing adsorption towers, one is an adsorption tower and the other one is a regeneration tower; during regeneration, a part of the ultra-high purity hydrogen from the PSA hydrogen extraction procedure is used as a regeneration carrier gas, and a regeneration tail gas formed after the regeneration is used as the regeneration carrier gas in the temperature swing adsorption step of the fine deamination procedure.

15. The method for extracting and recycling hydrogen from an MOCVD process exhaust gas by FTrPSA according to claim 1, wherein in the PSA hydrogen extraction, under an operating condition that an adsorption pressure is greater than or equal to 0.6 MPa.

16. The method for extracting and recycling hydrogen from an MOCVD process exhaust gas by FTrPSA according to claim 1, wherein gas flows between the washing in the pretreatment procedure and the temperature swing adsorption, de-oxygenation, PSA hydrogen extraction, deep dehydration procedures, a temperature swing adsorption regeneration carrier gas and a regeneration tail gas of the fine deamination procedure, as well as the feed gas before and after the pretreatment procedure, or a temperature swing adsorption regeneration carrier gas and a regeneration tail gas in the fine deamination procedure, as well as a regeneration tail gas from the deep dehydration, or a temperature swing adsorption effluent gas and a compressor end or multi-stage compression outlet gas in the fine deamination procedure, or an intermediate gas subjected to the de-oxygenation procedure and a regeneration carrier gas subjected to deep dehydration are involved, cold and heat exchange are performed to achieve energy balance of a FTrPSA based hydrogen extraction and recycling system, and energy of each procedure is also recycled.

* * * * *